United States Patent
Kim et al.

[11] Patent Number: 6,028,797
[45] Date of Patent: Feb. 22, 2000

[54] MULTI-BANK INTEGRATED CIRCUIT MEMORY DEVICES HAVING CROSS-COUPLED ISOLATION AND PRECHARGE CIRCUITS THEREIN

[75] Inventors: Gwang-young Kim, Chungcheongnam-do; Jong-hyoung Lim; Sang-seok Kang, both of Kyungki-do, all of Rep. of Korea

[73] Assignee: Samsung Electronics Co., Ltd., Rep. of Korea

[21] Appl. No.: 09/196,991

[22] Filed: Nov. 20, 1998

[30] Foreign Application Priority Data

Nov. 21, 1997 [KR] Rep. of Korea ............ 97-62044

[51] Int. Cl.[7] .................................. G11C 7/00
[52] U.S. Cl. ............................ 365/190; 365/203
[58] Field of Search ............................ 365/190, 203, 365/205, 207, 208, 63

[56] References Cited

U.S. PATENT DOCUMENTS

| | | | |
|---|---|---|---|
| 4,807,195 | 2/1989 | Busch et al. | 365/207 |
| 5,315,555 | 5/1994 | Choi | 365/207 |
| 5,682,343 | 10/1997 | Tomishima et al. | 365/203 |
| 5,689,461 | 11/1997 | Kaneko et al. | 365/203 |
| 5,875,141 | 2/1999 | Shirley et al. | 365/207 |
| 5,880,988 | 3/1999 | Bertin et al. | 365/63 |

*Primary Examiner*—David Nelms
*Assistant Examiner*—Anh Phung
*Attorney, Agent, or Firm*—Myers Bigel Sibley a Savjovec

[57] ABSTRACT

Multi-bank integrated circuit memory devices include first and second memory cell arrays having first and second pairs of differential bit lines electrically coupled thereto, respectively. A dual sense amplifier is also provided and this sense amplifier is electrically coupled together by a first pair of differential input/output lines. First and second isolation circuits are also provided. The first isolation circuit is electrically coupled to the first pair of differential bit lines and is responsive to a first control signal (C1). The second isolation circuit is electrically coupled to the second pair of differential bit lines and is responsive to a second control signal (C2). First and second equalization circuits are provided. The first equalization circuit is responsive to the second control signal and performs the function of equalizing a potential of the first pair of differential bit lines. The second equalization circuit is responsive to the first control signal and performs the function of equalizing a potential of the second pair of differential bit lines. These first and second control signals are generated by a control signal generator, in response to a row address.

19 Claims, 4 Drawing Sheets

6,028,797

MULTI-BANK INTEGRATED CIRCUIT MEMORY DEVICES HAVING CROSS-COUPLED ISOLATION AND PRECHARGE CIRCUITS THEREIN

RELATED APPLICATION

This application is related to Korean Application No. 97-62044, filed Nov. 21, 1997, the disclosure of which is hereby incorporated herein by reference.

FIELD OF THE INVENTION

The present invention relates to integrated circuit devices, and more particularly to integrated circuit memory devices containing multiple banks of memory therein.

BACKGROUND OF THE INVENTION

Highly integrated memory devices are typically required for many state-of-the-art applications requiring large quantities of data storage. Moreover, because the overall size of an integrated circuit memory device may be fixed, attempts to increase data storage capacity have generally focused on techniques to increase integration density by reducing memory device unit cell size and improving the efficiency of the control circuitry within the memory device. Notwithstanding these attempts to increase data storage capacity, many multi-bank integrated circuit memory devices 2 have banks of memory cell arrays (4, 6, 8, 10, 12, 14, 16) and sense amplifiers, equalization circuits and isolation circuits which are configured in a non-optimum manner and require separate control signals and circuits (18, 20, 22, 24, 26) for generating these control signals, as illustrated by FIG 1.

SUMMARY OF THE INVENTION

It is therefore an object of the present invention to provide improved integrated circuit memory devices.

It is another object of the present invention to provide improved multi-bank integrated circuit memory devices.

These and other objects, advantages and features of the present invention are provided by integrated circuit memory devices which contain multiple banks of memory therein. A preferred integrated circuit memory device comprises first and second memory cell arrays having first and second pairs of differential bit lines electrically coupled thereto, respectively. A dual sense amplifier is also provided. This dual sense amplifier may comprise first and second sense amplifiers which are electrically coupled together by a first pair of differential input/output lines. First and second isolation circuits are also provided. The first isolation circuit is electrically coupled to the first pair of differential bit lines and the first sense amplifier and is responsive to a first control signal (C1). The second isolation circuit is electrically coupled to the second pair of differential bit lines and the second sense amplifier and is responsive to a second control signal (C2). First and second equalization circuits are provided. The first equalization circuit is responsive to the second control signal and performs the function of equalizing a potential of the first pair of differential bit lines. The second equalization circuit is responsive to the first control signal and performs the function of equalizing a potential of the second pair of differential bit lines. These first and second control signals are generated by a control signal generator, in response to a row address.

In particular, according to a preferred aspect of the present invention, the first isolation circuit electrically connects the first pair of differential bit lines to the first sense amplifier when the first control signal is in an enabled state and the second isolation circuit electrically connects the second pair of differential bit lines to the second sense amplifier when the second control signal is in an enabled state. The control signal generator is also configured to generate the first and second control signals in respective enabled states during nonoverlapping time intervals only. The control signal generator is also configured to generate the first control signal in an enabled state in response to a first row address and is configured to generate the second control signal in an enabled state in response to a second row address which is different from the first row address. According to other aspects of the invention, the first isolation circuit comprises a pair of pass transistors which are responsive to the first control signal and the second isolation circuit comprises a pair of pass transistors which are responsive to the second control signal. The first equalization circuit also comprises a pair of pass transistors which are responsive to the second control signal and the second equalization circuit comprises a pair of pass transistors which are responsive to the first control signal.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
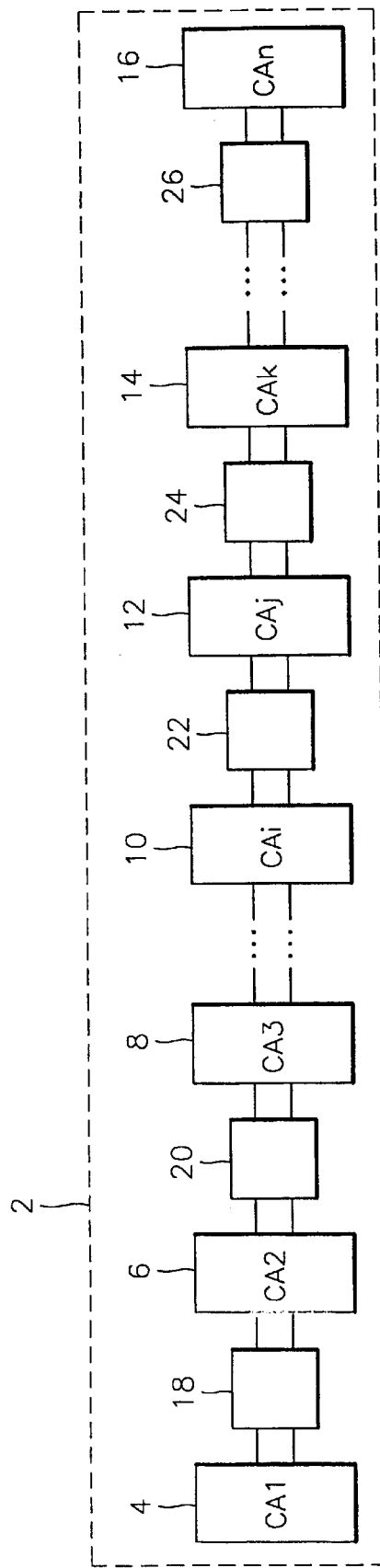
FIG. 1 is a block diagram of a multi-bank integrated circuit memory device according to the prior art.
Figure 2:
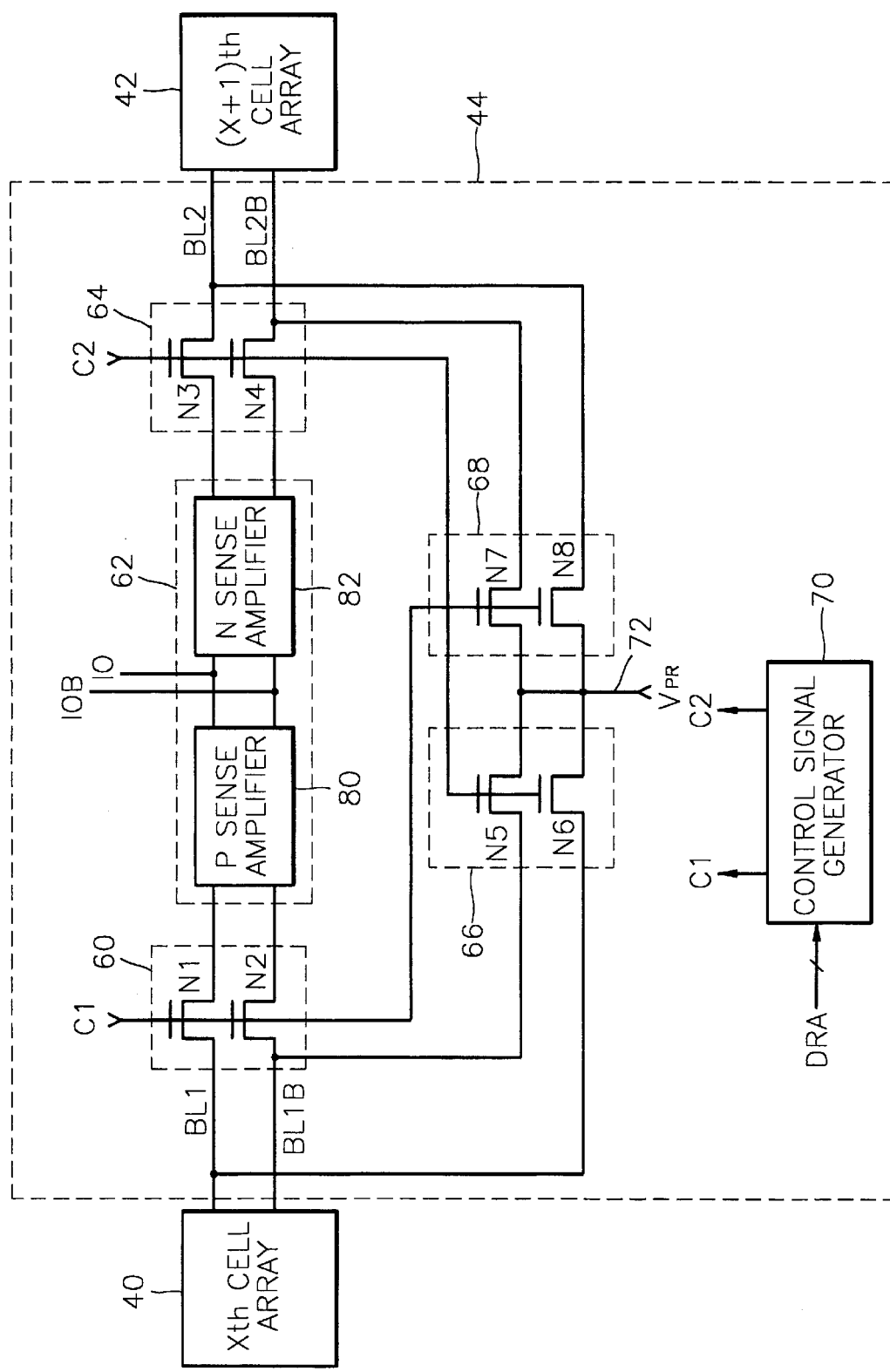
FIG. 2 is an electrical schematic of a preferred cell array controlling apparatus according to an embodiment of the present invention.

Referring now to FIG. 2, a preferred cell array controlling apparatus 44 includes a dual sense amplifier circuit 62 containing first and second complementary sense amplifiers 80 and 82, first and second isolation circuits 60 and 64, respectively, first and second equalization circuits 66 and 68, respectively, and a control signal generator 70. An Xth memory cell array 40 is electrically connected to the first isolation circuit 60 by a first pair of differential bit lines BL1 and BL1B. As illustrated, the first isolation circuit 60 comprises a pair of NMOS pass transistors N1 and N2 which are responsive to a first control signal C1. Accordingly, the application of a logic 1 first control signal C1 will turn on pass transistors N1 and N2 and electrically connect the first pair of differential bit lines BL1 and BL1B to the dual sense amplifier 62. An (X−1)th memory cell array 42 is also electrically connected to the second isolation circuit 64 by a second pair of differential bit lines BL2 and BL2B. Here, the second isolation circuit 64 comprises a pair of NMOS pass transistors N3 and N4 which are responsive to a second control signal C2. The application of a logic 1 second control signal C2 will turn on pass transistors N3 and N4 and electrically connect the second pair of differential bit lines BL2 and BL2B to the dual sense amplifier 62. Thus, during a reading operation, data can be transferred from the Xth or (X+1)th memory cell array (40 or 42) to a pair of differential input/output lines IO and IOB, via the first isolation circuit 60 or via the second isolation circuit 64.

According to a preferred aspect of this embodiment of the present invention, the first equalization circuit 66 is responsive to the second control signal C2 and the second equalization circuit 68 is responsive to the first control signal C1. Thus, the application of a logic 1 first control signal C1 (i.e., enabled C1) will turn on NMOS transistors N7 and N8 and cause the second differential bit lines BL2 and BL2B to become precharged at a level equal to a precharge potential $V_{PR}$ (on signal line 72). Similarly, the application of a logic 1 second control signal C2 (i.e., enabled C2) will turn on NMOS transistors N5 and N6 and cause the first differential bit lines BL1 and BL1B to become precharged at a level equal to the precharge potential $V_{PR}$. Accordingly, the second differential bit lines BL2 and BL2B can be precharged to a precharge potential while data is being read from or written to the Xth memory cell array 40 and the first differential bit lines BL1 and BL1B can be precharged to a precharge potential while data is being read from or written to the (X+1)th memory cell array 42.

Figure 3:
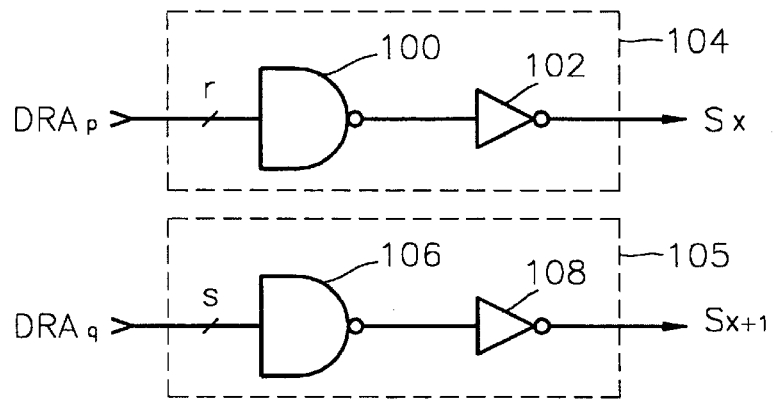
FIG. 3 is an electrical schematic of a select signal generator according to a preferred aspect of the present invention.
Figure 4:
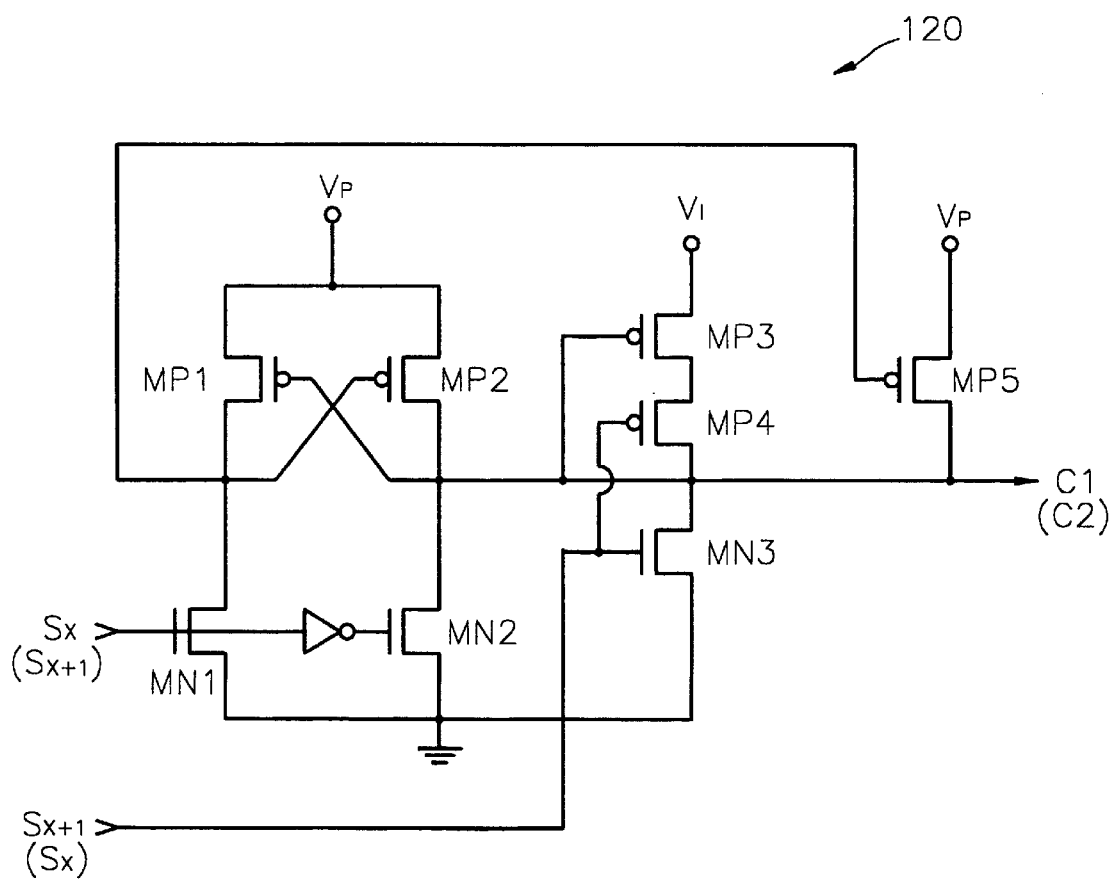
FIG. 4 is an electrical schematic of a control signal generator according to another preferred aspect of the present invention.

Referring now to FIGS. 3–4, the control signal generator 70 of FIG. 2 will be more fully described. In particular, the control signal generator 70 of FIG. 2 may include first and second select signal generators 104 and 105, respectively. The first select signal generator 104 includes a multi-input NAND gate 100 and an inverter 102 and the second select signal generator 105 includes a multi-input NAND gate 106 and an inverter 108. Based on this configuration, the first select signal generator 104 performs a boolean AND function on the bits of a first decoded row address DRAp and generates a first select signal Sx. This first decoded row address DRAp may be a multi-bit signal (e.g., 5 bits). The second select signal generator 105 also performs a boolean AND function on the bits of a second decoded row address DRAq and generates a second select signal Sx+1.

Referring now to FIG. 4, the control signal generator 70 of FIG. 2 may also include a first (and second) control signal generator 120, as illustrated. This first control signal generator 120 generates a first control signal C1 in an enabled state (e.g., logic 1) when the first select signal $S_x$ and the second select signal $S_{x+1}$ are set to a value of (Sx=1, Sx+1=0). The second control signal generator 120 generates a second control signal C2 in an enabled state (e.g., logic 1) when the second select signal $S_{x+1}$ and a first select signal $S_x$ are set to a value of (Sx+1=1, Sx=0). These states are illustrated by TABLE 1.

TABLE 1

| | C1 | C2 |
|---|---|---|
| $S_xS_{x+1}$ = 10 | logic level "high" (Vp) | logic level "low" (Vss) |
| $S_xS_{x+1}$ = 01 | logic level "low" (Vss) | logic level "high" (Vp) |
| In case other cell arrays excluding the xth and (x+1)th cell arrays are | logic level "high" ($V_1$) | logic level "high" ($V_1$) |

TABLE 1-continued

| | C1 | C2 |
|---|---|---|
| selected, or in case of precharge | | |

The first control signal generator 120 includes NMOS pull-down transistors MN1, MN2 and MN3, PMOS pull-up transistors MP1, MP2, MP3, MP4 and MP5 and an inverter 1, connected as illustrated. The boosted voltage Vp is also set at a higher level than the internal source voltage VI.

As will be understood by those skilled in the art, when Sx=1 and Sx+1=0, MN1=on, MN2=off, MN3=off, MP1=off, MP2=on, MP3=on, MP4=on and MP5=on. Under these conditions, the first control signal C1 will be enabled at a logic 1 value and the second control signal C2 will be disabled at a logic 0 value. In contrast, when Sx=0 and Sx+1=1, MN1=off, MN2=on, MN3=on, MP1=on, MP2=off, MP3=off, MP4=off and MP5=off. Under these conditions, the first control signal C1 will be disabled at a logic 0 value and the second control signal C2 will be enabled at a logic 1 value.

Figure 5:
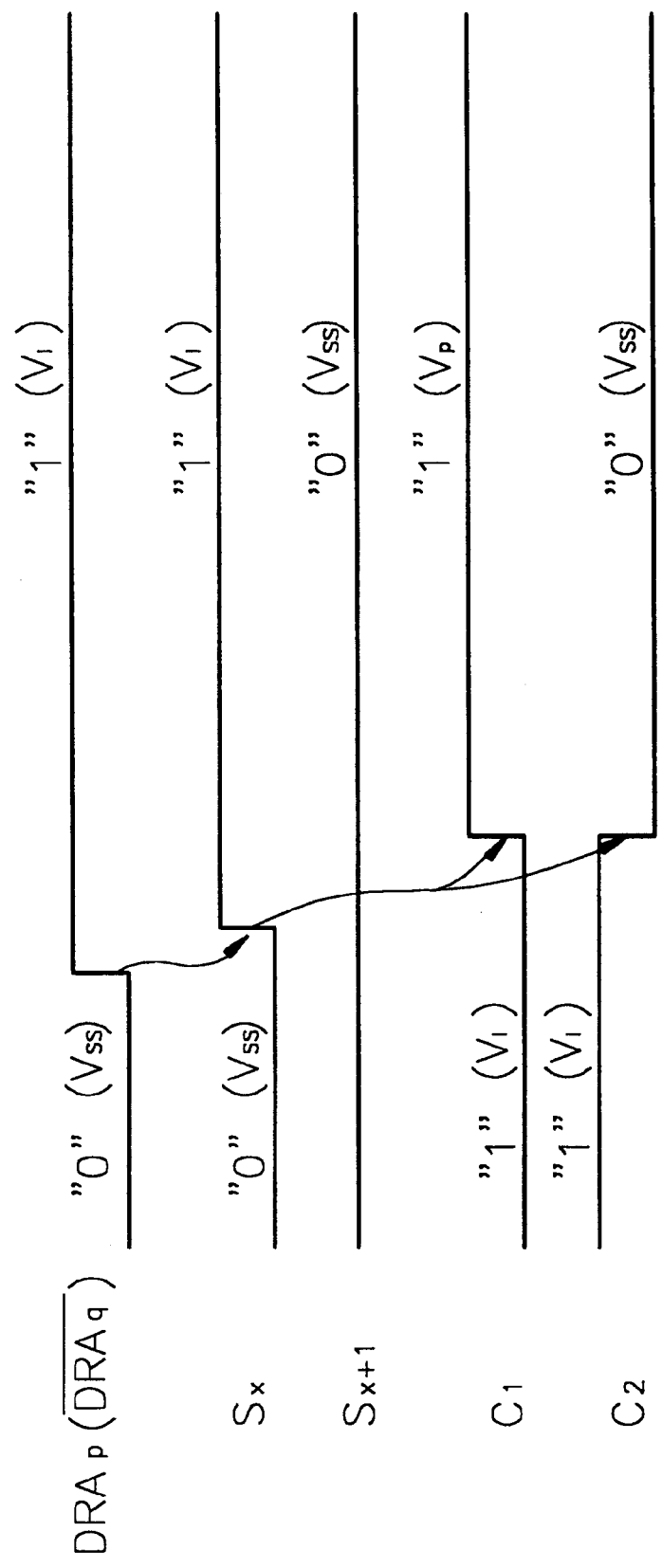
FIG. 5 is a timing diagram which illustrates operation of the devices of FIGS. 3 and 4.

Referring now to FIG. 5, a timing diagram which illustrates operation of the devices of FIGS. 3 and 4 is provided. As illustrated, the generation of the first decoded row address DRAp as (11111) will result in the generation of a logic 1 first select signal Sx and the generation of a second decoded row address DRAq which does not equal (11111) will result in the generation of a logic 0 second select signal Sx+1. This combination of the logic 1 first select signal Sx and the logic 0 second select signal Sx+1 (at the inputs of the first control signal generator 120 in FIG. 4) will cause the first control signal C1 to become enabled at a logic 1 level (to simultaneously turn on the first isolation circuit 60 and the second equalization circuit 68) and the second control signal C2 to become disabled at a logic 0 level to simultaneously turn off the second isolation circuit 64 and the first equalization circuit 66. Thus, a reduced number of signals having opposite phases can be used to control an integrated circuit memory device which is more highly integrated.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:

first and second memory cell arrays having first and second pairs of differential bit lines electrically coupled thereto, respectively;

a dual sense amplifier electrically coupled together by a first pair of differential input/output lines;

a first isolation circuit electrically coupled to the first pair of differential bit lines and said dual sense amplifier and responsive to a first control signal;

a second isolation circuit electrically coupled to the second pair of differential bit lines and said dual sense amplifier and responsive to a second control signal;

means, responsive to the second control signal, for equalizing a potential of the first pair of differential bit lines; and means, responsive to the first control signal, for equalizing a potential of the second pair of differential bit lines.

2. The memory device of claim 1, further comprising a control signal generator which generates the first and second control signals in response to a row address.

3. The memory device of claim 2, wherein the first isolation circuit electrically connects the first pair of differential bit lines to said dual sense amplifier when the first control signal is in an enabled state; wherein the second isolation circuit electrically connects the second pair of differential bit lines to said dual sense amplifier when the second control signal is in an enabled state; and wherein said control signal generator is configured to generate the first and second control signals in respective enabled states during nonoverlapping time intervals only.

4. The memory device of claim 3, wherein said control signal generator is configured to generate the first control signal in an enabled state in response to a first row address and is configured to generate the second control signal in an enabled state in response to a second row address which is different from the first row address.

5. The memory device of claim 4, wherein said first isolation circuit comprises a pair of pass transistors which are responsive to the first control signal; and wherein said second isolation circuit comprises a pair of pass transistors which are responsive to the second control signal.

6. The memory device of claim 5, wherein said means for equalizing a potential of the first pair of differential bit lines comprises a pair of pass transistors which are responsive to the second control signal; and wherein said means for equalizing a potential of the second pair of differential bit lines comprises a pair of pass transistors which are responsive to the first control signal.

7. The memory device of claim 2, wherein said control signal generator is configured to generate the first control signal in an enabled state in response to a first row address and is configured to generate the second control signal in an enabled state in response to a second row address which is different from the first row address.

8. The memory device of claim 7, wherein said first isolation circuit comprises a pair of pass transistors which are responsive to the first control signal; and wherein said second isolation circuit comprises a pair of pass transistors which are responsive to the second control signal.

9. The memory device of claim 8, wherein said means for equalizing a potential of the first pair of differential bit lines comprises a pair of pass transistors which are responsive to the second control signal; and wherein said means for equalizing a potential of the second pair of differential bit lines comprises a pair of pass transistors which are responsive to the first control signal.

10. The memory device of claim 2, wherein said control signal generator comprises first and second select signal generators.

11. The memory device of claim 10 wherein each of said first and second select signal generators performs a boolean AND function on a respective decoded row address.

12. An integrated circuit memory device, comprising:
first and second memory cell arrays having first and second pairs of differential bit lines electrically coupled thereto, respectively;
a dual sense amplifier electrically coupled to a first pair of differential input/output lines;
a first isolation circuit electrically coupled to the first pair of differential bit lines and said dual sense amplifier and responsive to a first control signal;
a second isolation circuit electrically coupled to the second pair of differential bit lines and said dual sense amplifier and responsive to a second control signal;
a first equalization circuit which electrically connects the first pair of differential bit lines together in response to the second control signal; and
a second equalization circuit which electrically connects the second pair of differential bit lines together in response to the first control signal.

13. The memory device of claim 12, further comprising a control signal generator which generates the first and second control signals in response to a row address.

14. The memory device of claim 12, wherein the first isolation circuit electrically connects the first pair of differential bit lines to said dual sense amplifier when the first control signal is in an enabled state; wherein the second isolation circuit electrically connects the second pair of differential bit lines to said dual sense amplifier when the second control signal is in an enabled state; and wherein said control signal generator is configured to generate the first and second control signals in respective enabled states during nonoverlapping time intervals only.

15. The memory device of claim 14, wherein said control signal generator is configured to generate the first control signal in an enabled state in response to a first row address and is configured to generate the second control signal in an enabled state in response to a second row address which is different from the first row address.

16. The memory device of claim 15, wherein said first isolation circuit comprises a pair of pass transistors which are responsive to the first control signal; and wherein said second isolation circuit comprises a pair of pass transistors which are responsive to the second control signal.

17. The memory device of claim 16, wherein said first equalization circuit comprises a pair of pass transistors which are responsive to the second control signal; and wherein said second equalization circuit comprises a pair of pass transistors which are responsive to the first control signal.

18. The memory device of claim 13, wherein said control signal generator is configured to generate the first control signal in an enabled state in response to a first row address and is configured to generate the second control signal in an enabled state in response to a second row address which is different from the first row address.

19. The memory device of claim 18, wherein said first isolation circuit comprises a pair of pass transistors which are responsive to the first control signal; and wherein said second isolation circuit comprises a pair of pass transistors which are responsive to the second control signal.

* * * * *